United States Patent [19]

Morishita et al.

[11] Patent Number: 4,735,880

[45] Date of Patent: Apr. 5, 1988

[54] PHOTOSENSITIVE COMPOSITION AND PATTERN FORMING PROCESS USING SAME

[75] Inventors: Hajime Morishita; Saburo Nonogaki, both of Tokyo; Nobuaki Hayashi, Saitama; Shoichi Uchino, Hachioji; Masahiro Nishizawa; Kiyoshi Miura, both of Mobara; Osamu Sasaya; Yoshifumi Tomita, both of Mobara, all of Japan

[73] Assignee: Hitachi, Ltd., Tokyo, Japan

[21] Appl. No.: 852,750

[22] Filed: Apr. 16, 1986

[30] Foreign Application Priority Data

Apr. 17, 1985 [JP] Japan .................. 60-80128

[51] Int. Cl.$^4$ .................. G03C 5/34; G03C 5/18; G03F 7/08; G03F 7/26

[52] U.S. Cl. .................. 430/28; 430/144; 430/178

[58] Field of Search .................. 430/144, 151, 28, 178

[56] References Cited

U.S. PATENT DOCUMENTS

| | | | |
|---|---|---|---|
| 3,650,750 | 3/1972 | Iwata et al. | 430/151 |
| 3,997,344 | 12/1976 | Schlesinger et al. | 430/144 |
| 4,269,918 | 5/1981 | Nonogaki et al. | 430/144 |
| 4,273,842 | 6/1981 | Nonogaki et al. | 430/144 |
| 4,370,401 | 1/1983 | Winslow et al. | 430/151 |
| 4,377,630 | 3/1985 | Morishita et al. | 430/144 |
| 4,537,851 | 8/1985 | Nonogaki et al. | 430/144 |

FOREIGN PATENT DOCUMENTS

| | | |
|---|---|---|
| 42704 | 12/1981 | European Pat. Off. |
| 100920 | 2/1984 | European Pat. Off. |
| 2028525 | 3/1980 | United Kingdom |

OTHER PUBLICATIONS

Windheltz, M., Ed., *The Merck Index*, 9th Ed., 1976, pp. 213, 737 and 738.

*Primary Examiner*—Charles L. Bowers, Jr.
*Attorney, Agent, or Firm*—Antonelli, Terry & Wands

[57] ABSTRACT

A photosensitive composition comprising (1) at least one diazonium compound selected from among salts and double salts of diazonium ions represented by the general formulas:

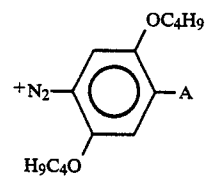

[I]

wherein A stands for a substituent selected from among

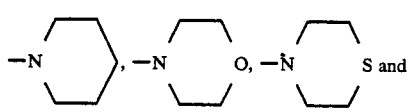

[II]

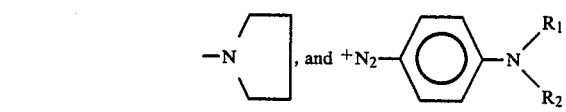

wherein $R_1$ and $R_2$ each stand for an alkyl or benzyl group with the proviso that the total number of carbon atoms of $R_1$ and $R_2$ is 8 to 16, and (2) at least one nitrate selected from the group consisting of calcium nitrate and magnesium nitrate and a pattern forming process using such a composition.

This composition gets sticky upon exposure to light.

3 Claims, 1 Drawing Sheet

PHOTOSENSITIVE COMPOSITION AND PATTERN FORMING PROCESS USING SAME

BACKGROUND OF THE INVENTION

The present invention relates to a photosensitive composition and a powder pattern forming process using such a composition.

The formation of powder layer pattern is carried out in, for example, preparation of a color picture tube. The interior side of the face plate of a color picture tube is coated with three different kinds of phosphors in dots or in stripes and among these phosphors, black powder is applied to form black matrix. Up to this time, a color picture tube has generally been produced as follows: First, black matrix is formed in the interior side of the face plate. A mixed coating material composed of a phosphor for the first color and a photosensitive composition is applied on the black matrix, dried, patternwise exposed to light to insolubilize the photosensitive composition at the exposed portion and washed with water, thus retaining an insolubilized portion alone on the face plate while removing the other portion. For phosphors for the second and third colors, a similar procedure is repeated respectively. Though a method of forming black matrix will not be described in detail here, it is more complicated than that of phosphor pattern. As described above, the color picture tube phosphor surface forming process is complicated and multiple runs of wet coating, water washing and drying are required.

As an improvement in such a process, some of the inventors of the present invention have previously proposed, in Japanese Laid-Open patent application No. 126861/78 (U.S. Pat. No. 4,273,842), a method of forming a color picture tube phosphor surface in a simple manner. This method was attained on the basis of a new finding that the photolytic product of an aromatic diazonium salt is able to accept powder particles, and it comprises (1) coating the inner surface of the face plate of a color picture tube with a photosensitive composition containing an aromatic diazonium salt as a photosensitive component and getting sticky by light exposure, thereby forming a coating layer on said surface, (2) subjecting said coating layer to patternwise exposure to make the exposed portion sticky and (3) contacting powder particles with the exposed portion to have said powder particles accepted by said coating layer. According to this method, the rest of powder particles can be easily removed by air spray or the like. Therefore, mere repetition of exposure and powder contact is required for the phosphors of the second and third colors and, if necessary, black matrix can also be formed according to the method. Further, once the coating layer is formed, it is possible to form as many phosphor powder patterns as desired.

Though the above method has advantages of saving of water and simplification of the forming step, it has also a problem in that the photosensitive composition has a somewhat lower sensitivity than that of the prior art.

SUMMARY OF THE INVENTION

An object of the present invention is to provide a photosensitive composition getting sticky by light exposure and having a high sensitivity and a pattern forming process using such a composition.

This and other objects are attained by a photosensitive compsoition which comprises (1) at least one diazonium compound selected from the group consisting of salts and double salts of diazonium ions represented by the general formulas:

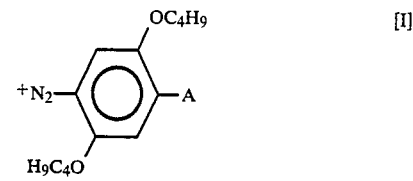

wherein A stands for a substituent selected from among

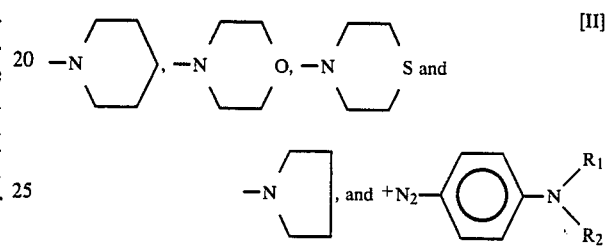

wherein $R_1$ and $R_2$ each stand for an alkyl or benzyl group with the proviso that the total number of carbon atoms of $R_1$ and $R_2$ is 8 to 16, and (2) calcium nitrate and/or magnesium nitrate, and a pattern forming process using such a composition.

DETAILED DESCRIPTION OF PREFERRED EMBODIMENTS

The above diazonium compound is a salt or double salt of diazonium ions represented by the above general formulas with a combination of Cl and a chloride (for example, $Cl.ZnCl_2$ or $Cl.\frac{1}{2}ZnCl_2$) or a Lewis acid such as $BF_4$ or $HSO_4$.

It is preferred that the substituents $R_1$ and $R_2$ of the above general formula (II) have 8 to 16 carbon atoms in total. For example, it is not preferred that both $R_1$ and $R_2$ are ethyl groups, because the number of carbon atoms is 4 in total. When one of $R_1$ and $R_2$ is an ethyl group and the other is a benzyl group, the total number of carbon atoms is nine, which is desirable. Though the reason will be more or less described below, it is not apparent. The alkyl group may be straight or may have a side chain.

An aromatic diazonium salt or double salt other than those represented by the above general formulas may be used as the diazonium compound in an amount of at most about 10% by weight, preferably at most 5% by weight, based on the total amount of the diazonium compounds.

The photosensitive composition of the present invention may contain a water-soluble organic polymer and/or a surfactant with a view to enhancing coatability when forming a coating film with the composition, which has already been proposed in the above Japanese Laid-Open patent application No. 126861/78. Examples of the water-soluble organic polymer include not only compounds described in the above Application but also other compounds, for example, polyvinyl alcohol, polyacrylamide, hydroxypropylmethyl cellulose, alginic acid and its esters and methyl vinyl ether-maleic anhydride copolymer.

It is preferred in the present invention to add a water-soluble organic polymer in a somewhat larger amount than that described in the above Japanese Laid-Open patent application, i.e., in an amount of at least 20% by weight based on the aromatic diazonium compound to assure homogeneous mixing of calcium nitrate and/or magnesium nitrate. The polymer is added preferably in an amount of 20 to 500% by weight, more preferably 30 to 300% by weight, based on the diazonium compound. The surfactant is preferably added in an amount of 0.001 to 0.1% by weight.

Figure 1:
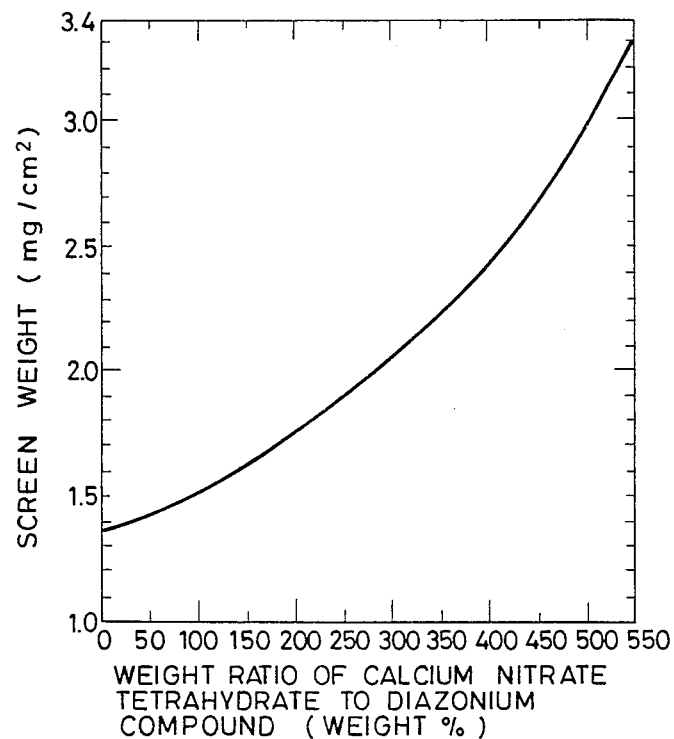
FIG. 1 is a graph showing the relationship between the amount of added calcium nitrate and screen weight.

The amount of calcium nitrate to be added was examined with the result as shown in FIG. 1. Various amounts of calcium nitrate was added to a composition comprising

| | |
|---|---|
| p-diazo-2,5-di-n-butoxy-N—phenyl-morpholine chloride zinc chloride double salt | 1 |
| propylene glycol alginate and | 0.6 |
| polyvinyl alcohol | 0.4 |

Water was added to the obtained mixture to make up to a total amount of 100 (the figures are parts by weight). According to the same conditions as the one which will be described in Example 1, a coating film was formed by the use of the resulting mixture, subjected to light exposure and contacted with a phosphor, thus determining a screen weight. The exposure time is defined as a time which has elapsed until the screen weight became substantially saturated in Example 1. As shown in FIG. 1, the larger the amount of added calcium nitrate, the larger the screen weight. However, if the amount of calcium nitrate is larger than 550% by weight (based on the diazonium compound), phosphor will adhere to a non-exposed portion too, in other words, so-called "fogging" will occur. Further, if it exceeds 400% by weight, very slight fogging will sometimes occur. On the other hand, if it is smaller than 10% by weight, the screen weight will increase only a little. Accordingly, the amount of calcium nitrate is preferably 10 to 500% by weight, more preferably 10 to 400% by weight. Further, the range where the screen weight and the operability are practically satisfied is 50 to 350% by weight.

Also when magnesium nitrate was used instead of calcium nitrate, a similar tendency as that described above was observed except that the screen weight attained when magnesium nitrate was added in a large amount was slightly smaller than that attained when calcium nitrate was used in such an amount.

A coating film containing a diazonium compound of the prior art, for example, 4-diazo-N,N-dimethylaniline chloride zinc chloride double salt becomes to be able to accept the powder, when about 60% of the whole is photolyzed. On the other hand, a coating film containing the diazonium compound of the present invention becomes capable of accepting the powder, when about 20% of the whole is photolyzed. Though the reason is not clear, it may be thought as follows: Though the coating film of the prior art must be crystallized, the coating film of the present invention need not be crystallized as a whole (in the thickness direction) and the molecular weight is larger, which may be a reason for the above described difference. The exact reason is yet unclear. The compound represented by the general formula (I) can be used, when only the surface of a film is crystallized, even if the whole (in the thickness direction) of the film is not crystallized. Further, the photolysis rate (photolysis ratio: quantum yield) of a film containing the diazonium compound represented by the above general formula is about twice that of a film containing 4-diazo-N,N-dimethylaniline chloride zinc chloride double salt, so that the former film can have a higher sensitivity than the latter film.

However, the screen weight tends to become saturated only in a small quantity. The screen weight can be increased by adding calcium nitrate or magnesium nitrate. These nitrates do not cause failures of an emitter when used in a color picture tube, because they do not contain any halogen. Further, a diazonium salt is decomposed in an aqueous alkaline solution, but neither calcium nitrate nor magnesium nitrate exhibits alkalinity in an aqueous solution. Therefore, the photosensitive composition of the present invention can be handled as an aqueous solution without causing any troubles.

Now, the present invention will be described by Examples. First, some compounds represented by the general formula (I) will be shown.

4-diazo-2,5-di-n-butoxy-N-phenylmorpholine, chloride zinc chloride double salt

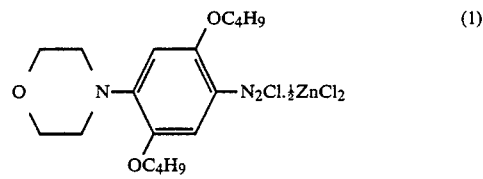

4-diazo-2,5-di-n-butoxy-N-phenylpiperidine chloride zinc chloride double salt

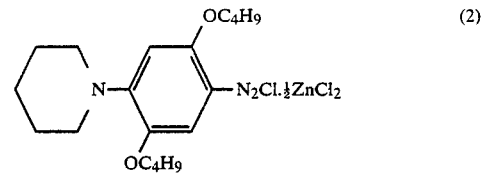

4-diazo-2,5-di-n-butoxy-N-phenylthiomorpholine chloride zinc chloride double salt

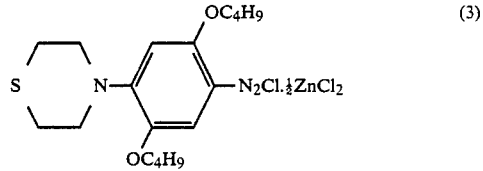

4-diazo-2,5-di-n-butoxy-N-phenylpyrrolidine chloride zinc chloride double salt

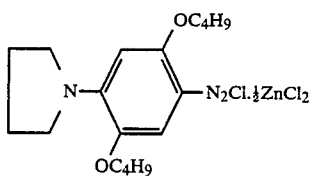

(4)

EXAMPLE 1

Coating materials having the following compositions 1 and 2 were prepared. The composition 1 is a comparative example according to the prior art and the composition 2 is an example according to the present invention. All figures are percentages by weight.

Composition 1

| | |
|---|---|
| p-diazo-N,N—dimethylaniline chloride zinc chloride double salt | 3.3 |
| propylene glycol alginate | 0.33 |
| water | the balance |

Composition 2

| | |
|---|---|
| 4-diazo-2,5-di-n-butoxy-N—phenyl-morpholine chloride zinc chloride double salt | 1 |
| propylene glycol alginate | 0.6 |
| polyvinyl alcohol | 0.4 |
| calcium nitrate | 2 |
| water | the balance |

Figure 2:
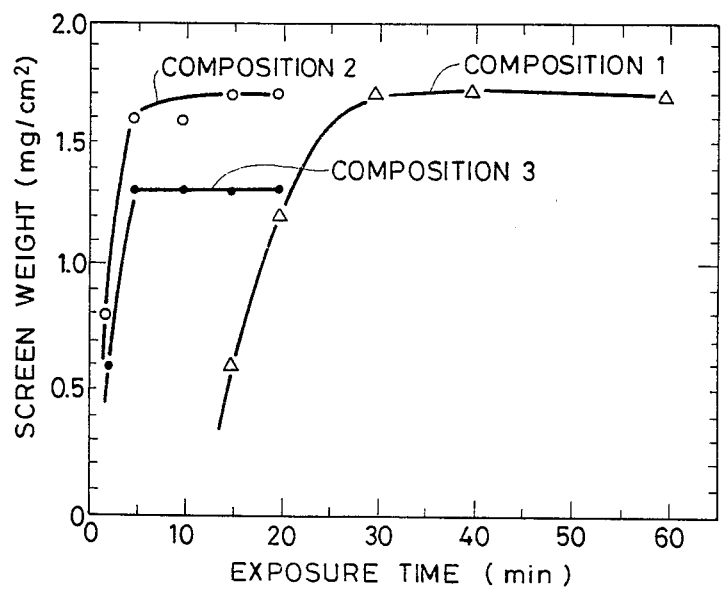
FIG. 2 is a graph showing the sensitivity of photosensitive compositions.

Each of the above compositions was applied on a glass plate by spin coating to form a 0.5 to 1.0 μm thick photosensitive film. The film was exposed to light from a 500W super-high pressure mercury arc lamp at a distance of 80 cm from said film with an illumination of 13 klux and contacted with phosphor powder. The powder on a non-exposed portion was removed by air spray to thereby deposit the powder on an exposed portion alone. The relationship between the exposure time and saturated screen weight is shown in FIG. 2. It can be understood from the results that the exposure time until the same screen weight (S.W) is attained is about 5 sec with the composition 2, while being about 30 sec with the composition 1. That is, the exposure time of the former is about a sixth of that of the latter. The composition 3 comprised the same components as the ones of the composition 2 except that no calcium nitrate was added. It is evident that the S.W. is apparently low. A similar result as that described above was obtained when magnesium nitrate was added instead of calcium nitrate.

EXAMPLES 2, 3 and 4

Composition 4

| | |
|---|---|
| 4-diazo-2,5-di-n-butoxy-N—phenyl-piperidine chloride zinc chloride double salt | 1 |
| propylene glycol alginate | 0.6 |
| polyvinyl alcohol | 0.4 |
| magnesium nitrate | 2 |
| water | the balance |

Composition 5

| | |
|---|---|
| 4-diazo-2,5-di-n-butoxy-N—phenylthiomorpholine chloride zinc chloride double salt | 1 |
| propylene glycol alginate | 0.6 |
| polyvinyl alcohol | 0.4 |
| calcium nitrate | 2 |
| water | the balance |

Composition 6

| | |
|---|---|
| 4-diazo-2,5-di-n-butoxy-N—phenyl-pyrrolidine chloride zinc chloride | 1 |
| propylene glycol alginate | 0.6 |
| polyvinyl alcohol | 0.4 |
| magnesium nitrate | 2 |
| water | the balance |

The composition 4, 5 and 6 wre examined in a similar manner as the one described in Example 1 to obtain the same results as the ones of the composition 2 shown in FIG. 2. The higher the nitrate content of the composition, the higher the powder-accepting power, as shown in FIG. 1.

EXAMPLE 5

Composition 7

| | |
|---|---|
| p-diazo-N—benzyl-N—ethylaniline chloride zinc chloride double salt | 1 |
| propylene glycol alginate | 0.6 |
| polyvinyl alcohol | 0.4 |
| calcium nitrate | 0.5 |
| water | the balance |

The above composition was applied on a glass substrate by spin coating to form a photosensitive film. The thickness of the film was 0.5 to 1.0 μm. The film was exposed to light from a 500 W super-high pressure mercury arc lamp at a distance of 80 cm from the film through a mask with an illumination of 13 klux for 20 seconds. A phosphor was placed on the film and deposited on an exposed portion alone by air-spray to give a screen weight of 1.7 mg/cm$^2$ which was equal to the saturated screen weight of the composition 2 shown in FIG. 2.

EXAMPLE 6

Composition 8

| | |
|---|---|
| p-diazo-N,N—dibutylaniline tetrafluoroborate | 1 |
| propylene glycol alginate | 0.6 |
| polyvinyl alcohol | 0.4 |
| calcium nitrate | 0.5 |
| water | the balance |

The above composition was applied on a glass substrate by spin coating to form a 0.5 to 1.0 μm thick film. The film was allowed to stand to thereby form a crystal of the diazonium salt on the surface of the film. The film was exposed to light with the same optical device as that descrbed above for 10 seconds. A phosphor was placed on the film and deposited on an exposed portion along to give a secreen weight equal to that described above.

EXAMPLE 7

Composition 9

| | |
|---|---|
| p-diazo-2,5-di-n-butoxy-N—phenyl-morpholine chloride zinc chloride double salt | 1 |
| propylene glycol alginate | 0.6 |
| polyvinyl alcohol | 0.4 |
| calcium nitrate | 1 |
| magnesium nitrate | 1 |
| water | the balance |

The composition 9 was applied on a glass substrate by spin coating to form a 0.5 to 1.0 μm thick film. The film was exposed to light with the same optical device as that described above through a mask for 5 seconds. A phosphor was placed on the film and deposited. The phosphor adhered to an exposed portion alone to give a screen weight equal to that described above.

When a mixture comprising the diazonium compounds represented by the general formulas (I) and (II) was used, similar results as those obtained in the above Examples were obtained.

EXAMPLE 8

A black matrix was formed on the inner surface of a face plate. A coating material having the composition 2 was applied on the matrix to form a coating film. The film was exposed to light with the first pattern. A phosphor for the first color was applied on the film. The rest of phosphor was removed by air-spray. In a similar manner, phosphor patterns for the second and third colors were formed. The coating film on an exposed portion was cured with ammonia gas and treated according to an ordinary method to produce a color picture tube.

As described above, the photosensitive composition of the present invention gets sticky upon exposure to light in a high sensitivity.

What is claimed is:

1. A pattern forming process which comprises applying a photosensitive composition containing an admixture of at least one photosensitive diazonium compound selected from the group consisting of salts and double salts of diazonium ions represented by the general formulae:

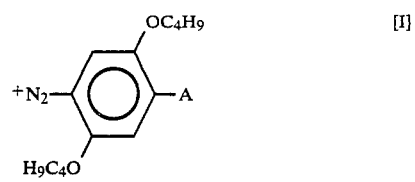

wherein A stands for a substituent selected from the group consisting of

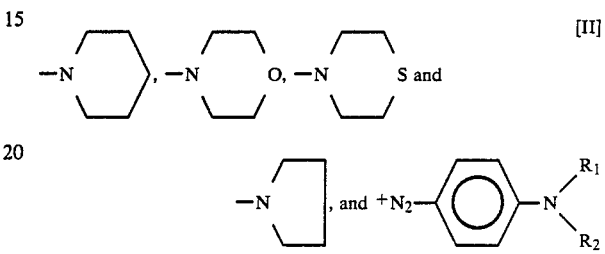

wherein $R_1$ and $R_2$ each stand for an alkyl or benzyl group, with the proviso that the total number of carbon atoms of $R_1$ and $R_2$ is 8 to 16, and 10 to 500% by weight, based on the weight of said diazonium compound, of at least one nitrate selected from the group consisting of calcium nitrate and magnesium nitrate, on a substrate to form a coating film thereon; subjecting the coating film to patternwise exposure to light to make the exposed portion sticky and contacting powder particles with the exposed film to have said particles deposited on the exposed portion.

2. A pattern forming process as set forth in claim 1, wherein said photosensitive composition further contains a water-soluble organic polymer in an amount of 20 to 500% by weight based on said diazonium compound.

3. A pattern forming process as set forth in claim 1 wherein the powder particles contacted with the exposed film are phosphor particles.

* * * * *